US009465093B2

(12) United States Patent
Greiser et al.

(10) Patent No.: US 9,465,093 B2
(45) Date of Patent: Oct. 11, 2016

(54) METHOD AND MAGNETIC RESONANCE SYSTEM FOR MR IMAGING OF A PREDETERMINED VOLUME SEGMENT OF A LIVING EXAMINATION SUBJECT BY STIMULATION OF THE EXAMINATION SUBJECT

(71) Applicants: Andreas Greiser, Erlangen (DE); Jens Guehring, Erlangen (DE); Randall Kroeker, Winnipeg (CA); Edgar Mueller, Heroldsbach (DE); Manuela Rick, Buckenhof (DE); Michaela Schmidt, Uttenreuth (DE); Aurelien Stalder, Nuremberg (DE)

(72) Inventors: Andreas Greiser, Erlangen (DE); Jens Guehring, Erlangen (DE); Randall Kroeker, Winnipeg (CA); Edgar Mueller, Heroldsbach (DE); Manuela Rick, Buckenhof (DE); Michaela Schmidt, Uttenreuth (DE); Aurelien Stalder, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 554 days.

(21) Appl. No.: 14/018,761

(22) Filed: Sep. 5, 2013

(65) Prior Publication Data
US 2014/0062481 A1 Mar. 6, 2014

(30) Foreign Application Priority Data
Sep. 5, 2012 (DE) .......................... 10 2012 215 718

(51) Int. Cl.
*G01R 33/56* (2006.01)
*G01R 33/563* (2006.01)

(52) U.S. Cl.
CPC .......... *G01R 33/56* (2013.01); *G01R 33/56366* (2013.01)

(58) Field of Classification Search
CPC .......................... G01R 33/56; G01R 33/56366
See application file for complete search history.

(56) References Cited

U.S. PATENT DOCUMENTS

| | | | | |
|---|---|---|---|---|
| 5,662,112 A * | 9/1997 | Heid | .................. | G01R 33/4806 324/309 |
| 5,732,702 A * | 3/1998 | Mueller | ............. | G01R 33/4806 324/309 |
| 6,073,041 A | 6/2000 | Hu et al. | | |
| 6,298,258 B1 * | 10/2001 | Heid | .................... | G01R 33/483 324/307 |
| 6,539,246 B2 * | 3/2003 | Heid | .................. | G01R 33/4806 600/410 |
| 2002/0107442 A1 | 8/2002 | Schreck | | |
| 2009/0196830 A1 | 8/2009 | Lamerichs et al. | | |
| 2011/0160567 A1 | 6/2011 | Stahmann et al. | | |

FOREIGN PATENT DOCUMENTS

CN 1775172 A 5/2006

OTHER PUBLICATIONS

Balaban et al: "Effect of Cardiac Flow on Gradient Recalled Echo Images of the Canine Heart," NMR in Biomedicine, vol. 7, (1994) pp. 89-95.
Atalay et al.: "Oxygenation in he Rabbit Myocardium: Assessment with Susceptibility—dependent MR Imaging," Radiology, vol. 189; (1993) pp. 759-764.
Ogawa et al: "Brain Magnetic Resonance Imaging with Contrast Dependent on Blood Oxygenation," Proc. Natl. Acad. Sci. USA, vol. 87, (1990) pp. 9868-9872.

* cited by examiner

*Primary Examiner* — Rodney Bonnette
(74) *Attorney, Agent, or Firm* — Schiff Hardin LLP

(57) ABSTRACT

In MR imaging of a predetermined volume segment of a living examination subject, the examination subject is stimulated with a defined stimulation pattern, MR data of the predetermined volume segment, are acquired, and MR images based on the MR data are generated that depend on the stimulation pattern. The predetermined volume segment is an internal organ or muscle tissue of the examination subject.

14 Claims, 2 Drawing Sheets

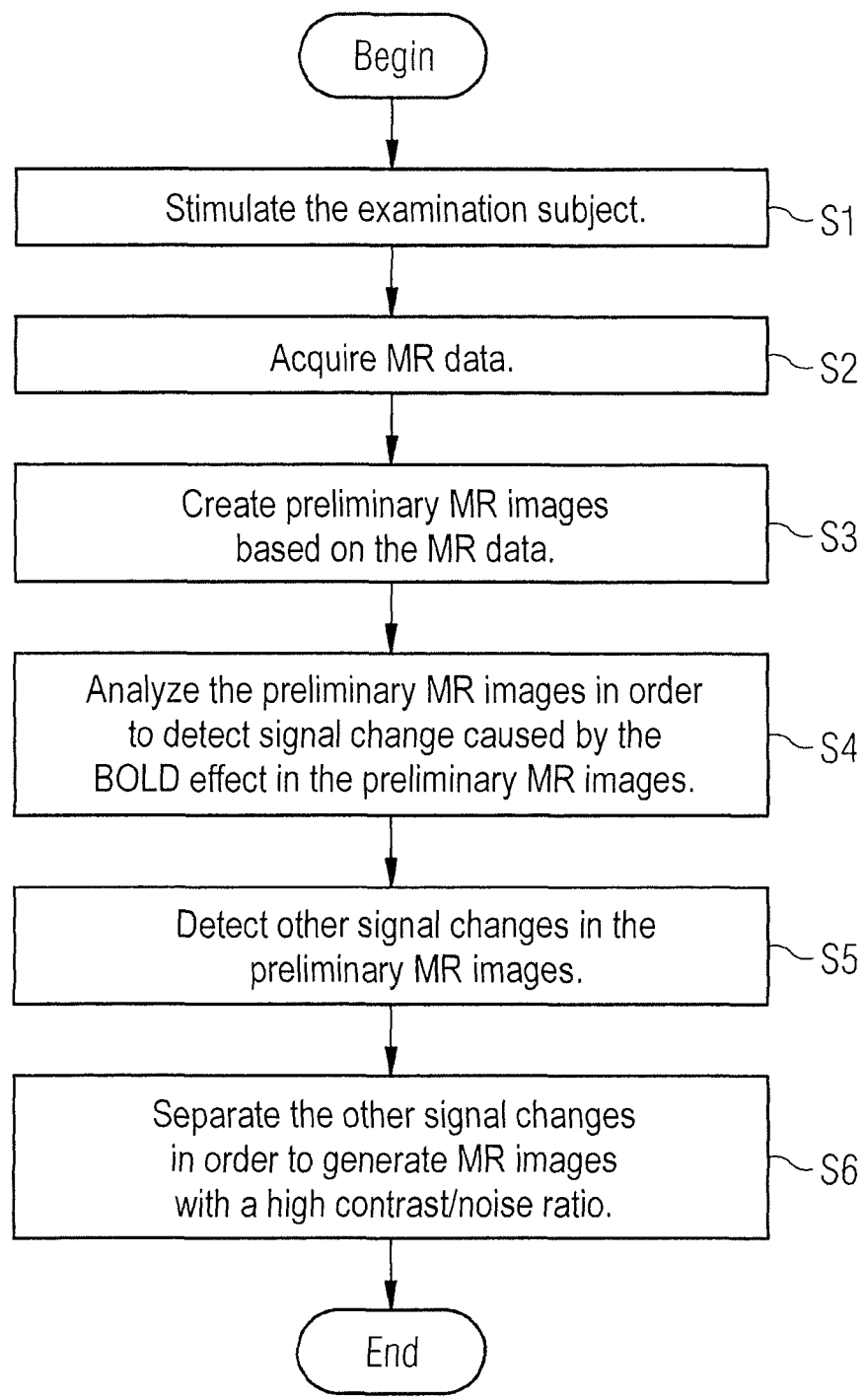

METHOD AND MAGNETIC RESONANCE SYSTEM FOR MR IMAGING OF A PREDETERMINED VOLUME SEGMENT OF A LIVING EXAMINATION SUBJECT BY STIMULATION OF THE EXAMINATION SUBJECT

BACKGROUND OF THE INVENTION

1. Field of the Invention

The present invention concerns a method and a magnetic resonance system in order to create MR images of a predetermined volume segment (in particular of the heart) of a living examination subject.

2. Description of the Prior Art

US 2011/0160567 A1 describes an implantable device (for example a defibrillator or a cardiac pacemaker) that detects information from a magnetic resonance system and adjusts parameters of the device depending on this information. For calibration of the device, the patient can be exposed to a stress and an MR image can be created while the patient is under this stress.

U.S. Pat. No. 6,073,041 describes an MR imaging of the brain in order to eliminate signal fluctuations due to physiological factors (breathing, heart beat).

In "Brain magnetic resonance imaging with contrast dependent on blood oxygenation", S. Ogawa et al., Proc. Natl. Acad. Sci., USA, Vol. 87, Pages 9868-9872, December 1990, it is described that the BOLD contrast can be used in MR imaging in order to achieve real time results at a living subject with regard to the oxygen enrichment in the brain under normal physiological conditions.

In "Oxygenation in the Rabbit Myocardium: Assessment with Susceptibility-dependent MR Imaging", M. K. Atalay et al., Cardiac Radiology 1993; 189: Pages 759-764, it is shown that it is possible in MR imaging in animal tests to determine the oxygen content in the heart muscle.

In "Effect of Cardiac Flow on Gradient Recalled Echo Images of the Caine Heart", R. S. Balaban, NMR in Biomedicine, Vol. 7, Pages 89-95, 1994, it is disclosed that the intensity of gradient echoes depends on an intensity of the coronary blood flow and the oxygen saturation in venous blood flow.

According to the prior art, a more robust, lower-artifact detection of local ischemic states of the heart muscle tissue is only possible with difficulty.

SUMMARY OF THE INVENTION

Therefore, an object of the present invention is to improve the MR imaging so that a robust, low-artifact detection of local ischemic states of a muscle tissue or of internal organs is achieved with MR images, better than is possible according to the prior art.

The present invention provides a method for MR imaging of a predetermined volume segment of a living examination subject. The predetermined volume segment is an internal organ of the examination subject or a muscle tissue of the examination subject, such that the predetermined volume segment is specifically not the brain of the examination subject. The method according to the invention includes the following steps:

Stimulate the examination subject with a defined stimulation pattern. Via the stimulation, in particular the oxygen saturation within the predetermined volume segment is varied. The stimulation can thereby also take place in the form of an indirect stimulation. An indirect stimulation is, for example, a stimulation in which the predetermined volume segment is not stimulated directly but rather is stimulated indirectly. For example, this is the case when a different volume segment (the brain, for example) is stimulated, and then the predetermined volume segment (the heart, for example) is stimulated (indirectly).

Acquire MR data of the predetermined volume segment. While the examination subject is stimulated, the MR data within the predetermined volume segment are acquired.

MR images are created depending on the stimulation pattern, based on the acquired MR data. In other words, the stimulation pattern or the manner of how the examination subject is stimulated during the acquisition of MR data is taken into account in the creation of the MR images.

Because the creation of the MR images takes place depending on the stimulation pattern, signal changes within the MR images that take place due to the stimulation can be separated from other signal changes that are not caused by the stimulation. Since these other signal changes are normally interferences, these other signal changes or interferences can be eliminated in the creation of the MR images so that low-artifact MR images can be created with a high contrast/noise ratio.

If the effect induced by the stimulation is the BOLD effect (i.e., in simplified form, the signal difference between an artificially induced an oxygen-deficient state and an oxygen saturation state) in the heart muscle, these changes caused by the BOLD effect in the MR data or MR images lie in the range of a few percent (and therefore on the order of magnitude of the noise) in prevalent nuclear magnetic resonance scanners with a field strength between 1.5 T and 3 T. In other words: in addition to the desired BOLD effect, MR images created according to the prior art (i.e. without consideration of the stimulation pattern) include unwanted signal portions that depend (among other things) on the selected acquisition technique and acquisition time. Organ movements (caused by breathing or heart contraction, for example), imperfections of the magnetic resonance system (for example B0 field drift, eddy currents, magnetic field inhomogeneities) and physiological effects (for example changes of the heart rate, changes in the blood circulation) are examples of causes for these interferences or unwanted signal components. Because the creation of the MR images according to the invention takes place depending on the stimulation pattern, the changes caused by the BOLD effect can be differentiated from the unwanted changes or interferences, such that these interferences can be eliminated from the created MR images. A robust, low-artifact detection of local ischemic states of the heart muscle tissue via the BOLD effect can be implemented with the MR images created according to the invention.

The acquisition of the MR data can take place using a measurement time series from which $T2^*$-weighted and/or T2-weighted MR images with high time resolution result. Two MR images in chronological succession are created with a time interval of 100 ms to 500 ms (or even with an interval of multiple seconds), such that two to ten MR images of the volume segment (the heart, for example) are created in a time period of one second.

The acquisition of the MR data can take place with a three-dimensional (3D) or two-dimensional (2D) method. The acquisition of a three-dimensional volume segment with what is known as a multislice 2D method (in which the MR data are acquired in multiple slices) is also possible according to the invention.

The stimulation of the examination subject can include at least one process among the following group of processes:

Supply a pharmaceutical substance to the examination subject. A medicine or other substance is thereby administered to the examination subject in order to thereby achieve an effect (for example a variation of the oxygen saturation) to be detected within the MR images in the predetermined volume segment.

Mechanical stimulation of the examination subject. The examination subject is thereby stimulated or stressed via stimulus or contacts perceived via the skin of the examination subject. This mechanical stimulus produces an effect (for example a variation of the oxygen saturation) to be detected within the MR images in the predetermined volume segment.

Mental stimulation of the examination subject. The examination subject is thereby stimulated or stressed via acoustic or optical stimuli, for example. In the predetermined volume segment, the mental stimulation leads to an effect (for example a variation of the oxygen saturation) to be detected within the MR images. For example, the mental stimulation of the examination subject for the (human) heart as a predetermined volume segment can mean that the heart rate is increased via a stimulation of the brain (for example via an acoustic or optical stimulus).

Stimulation via a change of any type of external circumstances which affect the examination subject. For example, these changes include a change of the temperature, a change of the composition of the air inhaled by the examination subject, and the ice water test ("cold pressure test").

The stimulation of the examination subject in particular takes place repetitively, but can also be time-variant (i.e. dependent on the time) in another form. The stimulation or the stimulation pattern can also include rest phases in which no stimulation occurs.

As noted above with regard to the BOLD effect, the creation of the MR images can include a detection of changes within the MR images that follow the stimulation pattern, i.e. in particular have a correlation with the stimulation pattern. Moreover, additional changes within the MR images are detected that have no or a slight correlation with the stimulation pattern. The MR images are now corrected such that the additional changes are eliminated from the MR images, whereby as a result MR images are created which have a good or high contrast/noise ratio.

In other words: according to this embodiment, preliminary MR images are created from the acquired MR data in a first step. Within these preliminary MR images, the changes which exhibit a correlation with the stimulation pattern and the additional changes which exhibit no or, respectively, slight correlation with the stimulation pattern are detected. The additional changes (which are interpreted as interference) are eliminated from these preliminary MR images in order to create as a result the MR images which have a good contrast/noise ratio.

The detection of the changes and/or the detection of the additional changes can take place with the aid a statistical analysis of the preliminary MR images depending on the stimulation pattern, for example.

This statistical analysis can be implemented with the GLM ("General Linear Model"), for example. With the statistical analysis, multiple preliminary MR images in chronological order are analyzed in which the voxels show a defined reaction (BOLD effect, for example) to the stimulation to which the examination subject is exposed during the acquisition of the MR data. The statistical analysis determines those voxels within the chronologically ordered preliminary MR images whose signal value/time curve exhibits a correlation with a corresponding time curve of the stimulation pattern which lies above a predetermined correlation threshold. Those voxels within the preliminary MR images in which the correlation lies above the correlation threshold are accordingly interpreted as those changes which follow from the stimulation pattern. The stimulation pattern is thereby in particular defined by the time curve of stress and rest phases, but also by the strength of the stimulations at a defined point in time. The stimulation pattern can follow a block design or be implemented as a shift register series.

In a block design, the stimulation paradigm or, respectively, the stimulation pattern comprises a repeating series of stimulation and rest (for example 30 s stimulation, 30 s rest). During this time period (of 60 s), ten measurements can respectively be implemented or, respectively, MR data can be generated, for example. The evaluation or analysis then determines the intensities or, respectively, changes in the preliminary MR images (created from the MR data) which follow the stimulation pattern.

In a shift register series (also known as event-based stimulation), stimulation phases and rest phases alternate in an irregular order, wherein the duration of the stimulation phases and rest phases can also be of different length. In the evaluation or, respectively, analysis of the preliminary MR images, specific effects (for example the reaction time of the body, the form of the signal response) must be taken into account in order to decide which changes follow the stimulation pattern. The analysis for this includes an anti-aliasing with pulse response (with what is known as the hemodynamic response function), for example.

In contrast to this, if temporal changes of voxels whose correlation with the time curve of the stimulation pattern lies below the predetermined correlation threshold are detected via the statistical analysis of the chronologically ordered preliminary MR images, these changes are identified as the additional changes which are interpreted as interference.

The evaluation or statistical analysis of the preliminary MR images can take place pixel-by-pixel or within specific regions (ROIs, "Regions of Interest") of the chronologically ordered preliminary MR images. These regions can thereby be determined depending on time, which is in particular the case if specific objects (for example heart, diaphragm) which are imaged by the MR images move.

In order to implement the changes and/or additional changes via an evaluation of regions within the MR images, a mean value of the voxels of such a region over time can be tracked, for example, in order to compare the temporal change of this mean value with the temporal change of the stimulation pattern.

Moreover, it is possible to detect a characteristic value which affects the acquired MR data in addition to the stimulation pattern. The detection of the changes and/or additional changes within the preliminary MR images can then be implemented depending on the detected characteristic value.

The detection of the changes and/or additional changes can be qualitatively further improved via the introduction of characteristic values or interference values which, for example, can be taken into account in addition to the stimulation pattern by the statistical analysis of the preliminary MR images.

Examples of characteristic values or interference values are:
- an EKG signal,
- a respiration signal (for example specification of the diaphragm position),
- a measure of the magnitude of a movement,
- a hemodynamic response function (an information about the blood flow to be expected, which can be learned from the already acquired MR images, for example)

By taking the respiration signals into account, it is also possible to acquire the MR data only when the diaphragm is located in a predetermined region during the measurement. MR data are thereby not acquired or discarded when the breathing position lies outside of the predetermined region during the MR data acquisition.

The detection of the changes within the preliminary MR images can in particular take place depending on features or properties within the preliminary MR images which are affected by the blood oxygenation and/or by flow effects.

For example, for this the BOLD effect can be detected as a feature or property in the preliminary MR images. However, using SSFP ("Single State Free Precession") sequences it is also possible to detect mixed contrasts from the BOLD effect and from flow effects or perfusion effects as the changes depending on the stimulation pattern that are to be detected, which can reinforce the localization and/or quantification of ischemia effects.

Moreover, the creation of the MR images can include a movement correction.

A movement correction is a prospective and/or retrospective registration of a time series of MR images in order to eliminate cardiac movements and respiration movements from the MR images with the aid of elastic and/or rigid body models. Registration, or image registration, is a procedure with which the same region, or at least similar regions, are determined in multiple MR images in order to bring these at least similar regions in the MR images into congruence with one another.

Furthermore, the creation of the MR images can include a spatial and/or temporal filtering of the (preliminary) MR images.

Through the filtering of the MR images, temporal or spatial outliers in the values for individual voxels of the MR images can be smoothed. By virtue of the values of the voxels of the MR images being both spatially and temporally smoothed, the signal-to-noise ratio of the MR images is improved.

To acquire the MR data, a sequence can be selected from the following group:
- single shot echo planar imaging. The entirety of k-space is thereby read out starting from an RF excitation with a gradient echo or spin echo sequence.
- Fast Low Angle Shot (FLASH). A fast sequence with which gradient echoes with low flip angles are generated.
- True Fast Imaging with Steady State Precession (True-FISP). A coherent technique (meaning that all voxels are in phase) in which matched gradients are used. In comparison to FLASH, the acquisition time is normally shorter and the contrast between blood and heart muscle is higher.

The contrast of the MR images acquired from the MR data can also be affected or improved by using preparation pulses (for example, as in a T2 preparation sequence or a saturation sequence).

In order to generate specific statistics, these statistics can be derived directly from the MR images. However, it is also possible to generate these statistics from parameters (T2 map, for example) derived from the MR images.

The acquisition of the MR data can be triggered (for example by an EKG signal) or take place without triggering. Moreover, the MR data can be acquired two-dimensionally or three-dimensionally. Finally, k-space can be segmented for data acquisition or k-space is read out completely starting from an RF excitation.

The present invention also encompasses a magnetic resonance system provided for the acquisition of MR data in a predetermined volume segment within a living examination subject. The predetermined volume segment is an internal organ (not the brain) or a muscle tissue of the examination subject. The magnetic resonance system has a basic field magnet, a gradient field system, one or more RF antennas, a control device to control the gradient field system and the RF antenna(s), to receive the measurement signals acquired by the RF antenna(s), and to evaluate the measurement signals and create the MR image data sets, and a stimulation device. The stimulation device is designed in order to stimulate the examination subject with a predefined stimulation pattern. The magnetic resonance system is designed in order to acquire the MR data and, with the control device, create MR images based on the MR data, depending on the stimulation pattern.

The stimulation device can be a device (a pump, for example) to administer specific doses of a medicine or other substances. The stimulation device is designed or operated to administer these doses according to a predetermined stimulation pattern. Moreover, the stimulation device can be a device that touches the examination subject according to a predetermined stimulation pattern. A sound source (a speaker, for example) in order to stimulate the examination subject with noises or audio signals according to a stimulation pattern, or a display in order to stimulate the examination subject with optical signals according to a stimulation pattern, can also be used as the stimulation device.

The advantages of the magnetic resonance system according to the invention essentially correspond to the advantages of the method according to the invention described in detail above.

Furthermore, the present invention encompasses a non-transitory, computer-readable data storage medium encoded with programming instructions (in particular software) that can be loaded into a memory of a programmable control device or a computer of a magnetic resonance system. With this encoded storage medium, all or various embodiments of the method according to the invention that are described in the preceding can be executed when the programming instructions run in the control device. The encoded instructions may require other conventional components (for example libraries and auxiliary functions) in order to realize the embodiments of the method. The instructions can be a source code (C++, for example) that must still be compiled and linked or that must only be interpreted, or an executable software code that has only to be loaded into the corresponding computer or control device for execution.

The electronically readable data medium can be a DVD, a magnetic tape or a USB stick, for example.

The results detected via the MR images created according to the invention can be presented in the form of feature maps in which "activated" regions (in which the BOLD effect is visible in the MR images, for example) are labeled in particular. The results that are registered can also be presented in the form of different regions (ROIs), for example via a regular sub-division or in the form of segment models adapted to an organ.

The present invention is in particular suitable to create MR images in the region of the human heart for the examination of an ischemia. Expressed differently, the present invention can be used to detect, assess and quantify ischemic events. Naturally, the present invention is not limited to this preferred field of application since the present invention an also be used (for example) to create MR images of other internal organs or of a muscle tissue of the examination subject.

BRIEF DESCRIPTION OF THE DRAWINGS

FIG. 2 is a flowchart of an embodiment according to the invention for the creation of MR images of a volume segment of an examination subject.

DESCRIPTION OF THE PREFERRED EMBODIMENTS

Figure 1:
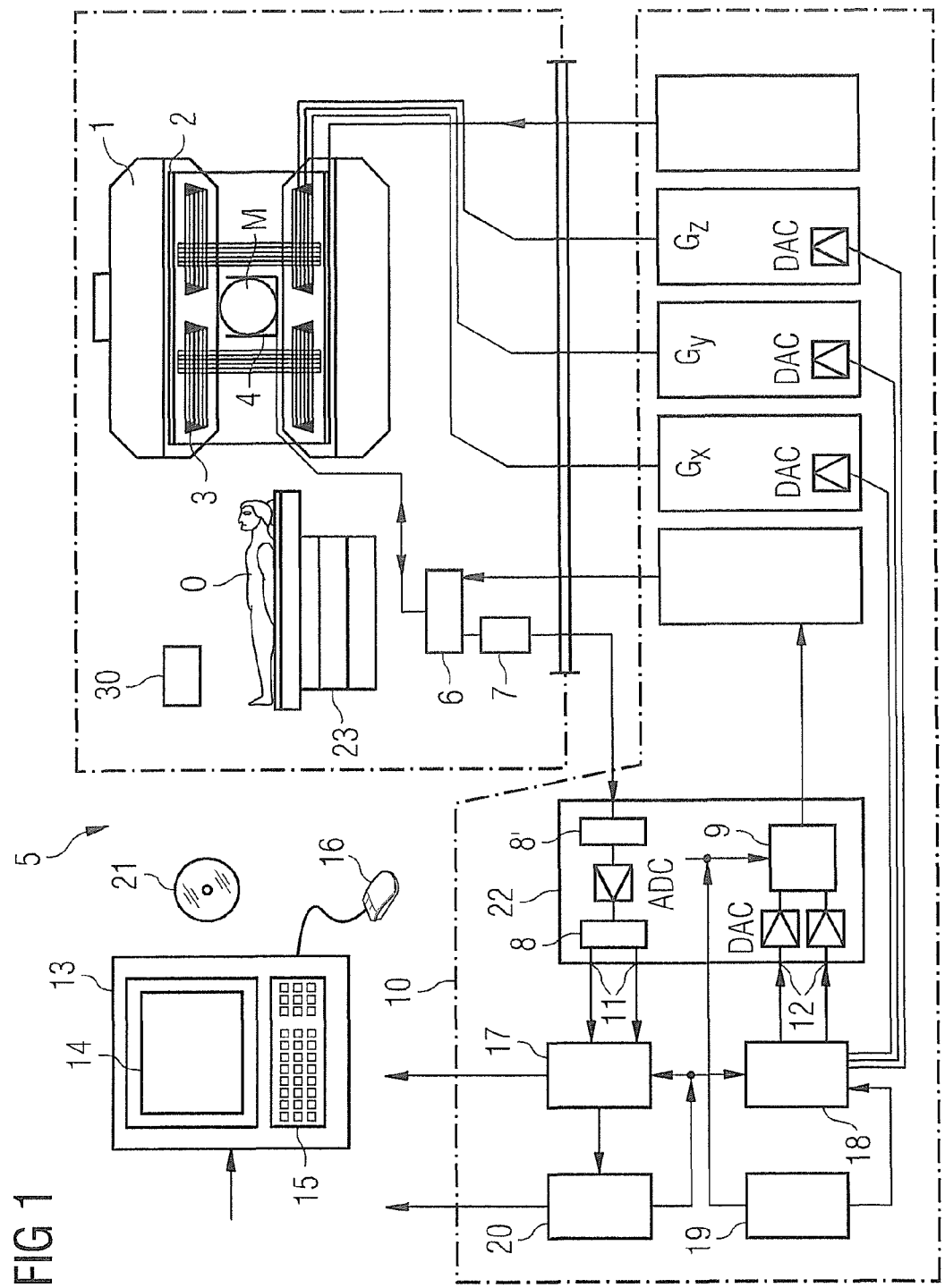
FIG. 1 shows a magnetic resonance system according to the invention.

FIG. 1 is a schematic depiction of a magnetic resonance system 5 (a magnetic resonance imaging or magnetic resonance tomography apparatus). A basic field magnet 1 generates a temporally constant, strong magnetic field for polarization or alignment of nuclear spins in a volume segment of a subject O, for example of a heart of a patient that is to be examined. The patient is examined while lying on a table 23 in the magnetic resonance system 5. The high homogeneity of the basic magnetic field that is required for the nuclear magnetic resonance measurement is defined in a typically spherical measurement volume M in which the parts of the human body that are to be examined are arranged. Shim plates made of ferromagnetic material are attached at suitable points to assist the homogeneity requirements, and in particular to eliminate temporally invariable influences. Temporally variable influences are eliminated by shim coils 2.

A cylindrical gradient field system 3 composed of three sub-windings is used in the basic field magnet 1. Each sub-winding is supplied with current by a corresponding amplifier to generate a linear (also temporally variable) gradient field in the respective direction of the Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. The amplifier comprises a digital/analog converter that is activated by a sequence controller 18 for accurately-timed generation of gradient pulses.

Located within the gradient field system 3 are one or more radio-frequency antennas 4 that convert the radio-frequency pulses emitted by a radio-frequency power amplifier into an alternating magnetic field for excitation of the nuclei and alignment of the nuclear spins of the subject O to be examined or of the region of the subject O that is to be examined. Each radio-frequency antenna 4 has one or more RF transmission coils and one or more RF reception coils in the form of an annular (advantageously linear or matrix-like) arrangement of component coils. The alternating field emanating from the precessing nuclear spins—i.e. normally the nuclear spin echo signals caused by a pulse sequence made up of one or more radio-frequency pulses and one or more gradient pulses—is also converted by the RF reception coils of the respective radio-frequency antenna 4 into a voltage (measurement signal) that is supplied via an amplifier 7 to a radio-frequency reception channel 8 of a radio-frequency system 22. The radio-frequency system 22 furthermore has a transmission channel 9 in which the radio-frequency pulses are generated for the excitation of the nuclear magnetic resonance. The respective radio-frequency pulses are digitally represented in the sequence controller 18 as a series of complex numbers based on a pulse sequence predetermined by the system computer 20. This number sequence is supplied as a real part and imaginary part to a digital/analog converter in the radio-frequency system 22 via respective inputs 12, and from said digital/analog converter to the transmission channel 9. In the transmission channel 9, the pulse sequences are modulated on a radio-frequency carrier signal whose base frequency corresponds to the center frequency.

The switching from transmission operation to reception operation takes place via a transmission/reception diplexer 6. The RF transmission coils of the radio-frequency antenna(s) 4 radiate(s) the radio-frequency pulses for excitation of the nuclear spins into the measurement volume M, and resulting echo signals are scanned via the RF reception coil(s). The acquired magnetic resonance signals are phase-sensitively demodulated to an intermediate frequency in a reception channel 8' (first demodulator) of the radio-frequency system 22 and digitized in an analog/digital converter (ADC). This signal is further demodulated to a frequency of 0. The demodulation to a frequency of 0 and the separation into real part and imaginary part occurs in a second demodulator 8 after the digitization in the digital domain. An MR image or three-dimensional image data set is reconstructed by an image computer 17 from the measurement data acquired in such a manner. The administration of the measurement data, the image data and the control programs takes place via the system computer 20. Based on a specification with control programs, the sequence controller 18 monitors the generation of the respective desired pulse sequences and the corresponding scanning of k-space. In particular, the sequence controller 18 controls the accurately-timed switching of the gradients, the emission of the radio-frequency pulses with defined phase amplitude and the reception of the nuclear magnetic resonance signals. The time base for the radio-frequency system 22 and the sequence controller 18 is provided by a synthesizer 19. The selection of corresponding control programs to generate an MR image (which control programs are stored on a DVD 21, for example) and the presentation of the generated MR image take place via a terminal 13 which comprises a keyboard 15, a mouse 16 and a monitor 14.

While the MR data are being acquired, the patient or the examination subject O is stimulated with the aid of a stimulation device 30 of the magnetic resonance system 5, depending on a stimulation pattern, so that specific changes in the MR images that are reconstructed from the MR data follow this stimulation pattern.

Moreover, with reference character 10 FIG. 1 shows a control device of the magnetic resonance system 5 for controlling the gradient field system 3 and the at least one RF antenna 4, to receive the measurement signals acquired by the at least one reception coil element and to evaluate the measurement signals and create the MR data.

A workflow according to the invention for the creation of MR images of the heart of an examination subject is presented in FIG. 2.

In Step S1, the examination subject is stimulated via optical or acoustic stimuli, for example, wherein these stimuli follow a predefined stimulation pattern. During this stimulation, MR data are acquired in Step S2. In Step S3, preliminary MR images are created based on these MR data.

These preliminary MR images are analyzed in the next Step S4 in order to detect signal changes in the preliminary MR images that are caused by the BOLD effect. Simultaneously with Step S4, in Step S5 different signal changes are detected in the preliminary MR images. The signal changes differ from the different signal changes due to the dependency on the stimulation pattern. While the signal changes have a close correlation with the stimulation pattern, the different signal changes have only a slight correlation or no correlation with the stimulation pattern.

In Step S6, the different signal changes (which represent interference within the preliminary MR images) are removed from the preliminary MR images in order to generate as a result MR images with a high contrast/noise ratio.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method for generating a magnetic resonance (MR) image of a predetermined volume in a living examination subject, comprising:
    while a living examination subject is located in an MR data acquisition unit, stimulating the examination subject with a defined stimulation pattern that produces physiological changes in muscle tissue of the examination subject that track said stimulation pattern;
    operating the data acquisition unit to acquire MR data from a predetermined volume of the examination subject that includes said muscle tissue during stimulation of the examination subject with said defined stimulation pattern;
    supplying the acquired MR data to a computerized processor and, in said processor, automatically generating an MR image of said predetermined volume, in which said physiological changes are represented, from said acquired MR data, by executing an image generating algorithm dependent on said stimulation pattern in which signal changes within the MR image, which occur due to the physiological changes, are separated from signal changes within the MR image that occur due to a source other than said stimulation pattern; and
    making said MR image available at an output of the processor in electronic form as a data file.

2. A method as claimed in claim 1 comprising stimulating the examination subject with said defined stimulation pattern selected from the group consisting of a pattern of supplying a pharmaceutical substance to the examination subject, a pattern of mechanical stimulation of the examination subject, a pattern of mental stimulation of the examination subject, and a pattern of changing external circumstances that have a sensory or mental effect on the examination subject.

3. A method as claimed in claim 1 comprising:
    in said image generating algorithm, detecting said signal changes within said MR image that occur due to said physiological changes, by detecting changes within said MR image that follow said stimulation pattern;
    in said image generating algorithm, detecting said signal changes in said MR image that are not caused by said stimulation by detecting additional changes within said MR image that do not follow said stimulation pattern; and
    generating said MR image with a correction that eliminates an influence of said additional signals in said MR image and thereby increasing a contrast/noise ratio in said MR image.

4. A method as claimed in claim 3 comprising detecting said changes in said MR image that follow and that do not follow said stimulation pattern by applying a statistical analysis in said image generating algorithm to said changes in said MR image.

5. A method as claimed in claim 3 comprising detecting said changes in said MR image that follow and that do not follow said stimulation pattern by evaluating only sub-regions of said MR image.

6. A method as claimed in claim 3 comprising detecting a characteristic value that effects the detected MR data in addition to said stimulation pattern, and detecting said changes that follow and that do not follow said stimulation pattern additionally by identifying changes in said MR image that are dependent on the detected characteristic value.

7. A method as claimed in claim 3 comprising detecting said changes in said MR image that follow and that do not follow said stimulation pattern using features within said MR image that are effected by at least one of blood oxygenation and fluid flow.

8. A method as claimed in claim 1 comprising, in said image creating algorithm, executing a movement correction and embodying said movement correction in said MR image.

9. A method as claimed in claim 1 comprising, in said image generating algorithm, executing at least one of a spatial filtering and a temporal filtering of said MR data.

10. A method as claimed in claim 1 comprising acquiring said MR data by operating said data acquisition device with a pulse sequence selected from the group consisting of a single shot echo planar imaging sequence, a Fast Low Angle Shot sequence, and a True Fast Imaging with Study State Precession sequence.

11. A method as claimed in claim 1 wherein said physiological changes are changes in the blood oxygen level in said muscle tissue in said predetermined volume of the examination subject.

12. A method as claimed in claim 11 comprising selecting said predetermined volume to encompass the heart of the examination subject, and wherein said muscle tissue is heart muscle tissue.

13. A magnetic resonance system comprising:
    a magnetic resonance data acquisition unit;
    a stimulation pattern source that stimulates a living examination subject with a defined stimulation pattern that produces physiological changes in muscle tissue of the examination subject that track said stimulation pattern;
    a control unit configured to operate the data acquisition unit, while the examination subject is located in the MR data acquisition unit and is being stimulated with said defined stimulation pattern, to acquire MR data from a predetermined volume of the examination subject that includes said muscle tissue during stimulation of the examination subject with said defined stimulation pattern;
    a computerized processor supplied with the acquired MR data said processor being configured to automatically generate an MR image, in which said physiological changes are represented, of said predetermined volume from said acquired MR data, by executing an image generating algorithm dependent on said stimulation pattern in which signal changes within the MR image, which occur due to the physiological changes, are separated from signal changes within the MR image that occur due to a source other than said stimulation pattern; and said processor being configured to make said MR image available at an output of the processor in electronic form as a data file.

14. A non-transitory, computer-readable data storage medium encoded with programming instructions, said storage medium being loaded into a computerized control and evaluation system of a magnetic resonance (MR) system, said magnetic resonance system comprising an MR data acquisition unit, and said control instructions causing said control and evaluation system to:

while a living examination subject is located in the MR data acquisition unit, stimulate the examination subject with a defined stimulation pattern that produces physiological changes in muscle tissue of the examination subject that tracks said stimulation pattern;

operate the data acquisition unit to acquire MR data from said muscle tissue of the examination subject during stimulation of the examination subject with said defined stimulation pattern;

automatically generate an MR image, in which said physiological changes are represented, of said predetermined volume from said acquired MR data, by executing an image generating algorithm dependent on said stimulation pattern in which signal changes within the MR image, which occur due to the physiological changes, are separated from signal changes within the MR image that occur due to a source other than said stimulation pattern; and make said MR image available at an output of the control and evaluation system in electronic form as a data file.

\* \* \* \* \*